United States Patent
Lee et al.

(10) Patent No.: US 6,225,226 B1
(45) Date of Patent: May 1, 2001

(54) METHOD FOR PROCESSING AND INTEGRATING COPPER INTERCONNECTS

(75) Inventors: Fu-Sheng Lee, Tai-Chung; Chien-Chen Chen; Chen-Ting Lin, both of Hsin-Chu; Cheh-Chieh Lu, Hsinchu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/458,728

(22) Filed: Dec. 13, 1999

(51) Int. Cl.$^7$ .................................................. H01L 21/00
(52) U.S. Cl. .............................. 438/692; 216/18; 216/38; 216/88; 438/740; 438/754
(58) Field of Search ...................................... 438/633, 634, 438/691, 637, 692, 645, 672, 723, 724, 743, 744, 740, 745, 754; 216/38, 88, 89, 18; 156/345 LP

(56) References Cited

U.S. PATENT DOCUMENTS

| | | | |
|---|---|---|---|
| 4,980,034 | 12/1990 | Volfson et al. | 204/38.4 |
| 5,011,580 | 4/1991 | Pan et al. | 204/15 |
| 5,429,987 | 7/1995 | Allen | 437/187 |
| 5,674,787 | 10/1997 | Zhao et al. | 437/230 |
| 5,691,238 | 11/1997 | Avanzino et al. | 437/195 |
| 5,693,568 | 12/1997 | Liu et al. | 437/195 |
| 5,891,804 | 4/1999 | Havemann et al. | 438/674 |
| 6,121,146 * | 9/2000 | Yoon et al. | 438/692 |
| 6,127,258 * | 10/2000 | Watanabe et al. | 438/692 X |
| 6,150,272 * | 11/2000 | Liu et al. | 438/692 |

* cited by examiner

Primary Examiner—William Powell
(74) Attorney, Agent, or Firm—George O. Saile; Stephen B. Ackerman; William J. Stoffel

(57) ABSTRACT

A method for forming copper interconnects, without inducing copper diffusion, by eliminating the copper chemical-mechanical polishing process. A semiconductor structure is provided having a first metal layer thereover. A first inter-metal dielectric layer is formed over the first metal layer and planarized. A first resist layer is formed over the first inter-metal dielectric layer, and the first resist layer and the first inter-metal dielectric layer are patterned to form via openings with the first metal layer forming the bottoms of the via openings. A barrier/seed layer, comprising a barrier layer and an overlying seed layer, is formed on the sidewalls and bottoms of the via openings. A self-align layer, composed of a high-resistivity, inorganic material, is formed over the barrier/seed layer. The self-align layer is patterned to reform the via openings and to form trench openings, exposing the barrier/seed layer on the bottoms and sidewalls of the via openings and on the bottoms of the trench openings. A copper layer is electroplated onto the exposed barrier/seed layer at the bottoms and sidewalls of the via openings and on the bottom of the trenches. The remaining portions of the self-align layer removed, then the exposed portions of the barrier/seed layer are removed.

15 Claims, 6 Drawing Sheets

METHOD FOR PROCESSING AND INTEGRATING COPPER INTERCONNECTS

BACKGROUND OF INVENTION

1. Field of the Invention

This invention relates generally to fabrication of a semiconductor device and more particularly to a method for forming a copper structure, such as interconnections without performing a copper chemical-mechanical polishing (CMP) step, reducing the risk of copper contamination.

2. Description of the Prior Art

Integrated circuits continue to increase in complexity each year. As applications develop for memories, microprocessors, and minicomputers there is an increasing demand for greater microminiturization, greater switching speeds, and smaller and less costly integrated circuit semiconductor devices.

Increased device microminiturization improves device performance and packing density while reducing cost per unit. However, microminiturization reduces yield and reliability, and degrades interconnect performance and noise margins.

Continued microminiturization of semiconductor devices using non-scaling aluminum lines would require the use of more metal layers, multi-level interconnections, and global planarization. The use of copper for interconnect and line metallurgy has long been considered as a possible alternative metallization material to aluminum and aluminum alloys due to its low resistivity and ability to reliably carry high current densities. However, its use has presented many manufacturing problems, such as the possibility of diffusion into the semiconductor substrate, the low adhesive strength of copper to various dielectric materials, and the difficulty in planarizing a copper layer without erosion or dishing occurring which reduces the performance and impedes the ability to stack multiple layers.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,011,580 (Pan et al.) discloses a copper plating process where a photoresist layer is used as a mask to form copper lines/interconnects during a rework process. However, this patent does not disclose or suggest planarizing the copper structures.

U.S. Pat. No. 5,693,568 (Lui et al.) shows a process for a dual-damascene shaped interconnect by depositing metals and patterning.

U.S. Pat. No. 5,691,238 (Avanzino et al.) shows a subtractive dual-damascene process.

U.S. Pat. No. 5,674,787 (Zhao et al.) teaches a copper interconnect formed by a selective electroless copper deposition.

U.S. Pat. No. 5,429,987 (Allen) teaches a copper interconnect formed by a selective copper deposition.

U.S. Pat. No. 4,980,034 (Volfson et al.) describes, generally, subtractive processes to form metal lines/interconnects.

U.S. Pat. No. 5,891,804 (Havermann et al.) teches a selective copper interconnect method.

SUMMARY OF THE INVENTION

It is an object of the present invention to provide a method for forming a copper structure with reduced risk of copper contamination.

It is another object of the present invention to provide a method for forming a copper structure without using a copper CMP process.

It is another object of the present invention to provide a method for forming a copper structure which is compatible with multi-layer architecture.

It is yet another object of the present invention to provide a producible and economical method for forming copper interconnects and lines in tenches in a dielectic layer using a self-aligned copper electroplating process.

To accomplish the above objectives, the present invention provides a method for forming copper interconnects, without inducing copper diffusion, by eliminating the copper chemical-mechanical polishing process. A semiconductor structure is provided having a first metal layer thereover. A first inter-metal dielectric layer is formed over the first metal layer and planarized. A first resist layer is formed over the first inter-metal dielectric layer, and the first resist layer and the first inter-metal dielectric layer are patterned to form via openings with the first metal layer forming the bottoms of the via openings. A seed layer is formed on the sidewalls and bottoms of the via openings. A self-align layer, composed of a high-resistivity, inorganic material, is formed over the seed layer. The self-align layer is patterned to reform the via openings and to form trench openings, exposing the seed layer on the bottoms and sidewalls of the via openings and on the bottoms of the trench openings. A copper layer is electroplated onto the exposed seed layer at the bottoms and sidewalls of the via openings and on the bottom of the trenches. The remaining portions of the self-align layer removed, then the exposed portions of the seed layer are removed.

The present invention provides considerable improvement over the prior art. Because no copper chemical-mechanical polishing is required, the risk of copper migration and reduced dielectric strength and/or shorting is reduced. The method of the present invention can be economically performed using existing semiconductor processing equipment and technology.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming copper interconnects for a semiconductor device which does not require a copper CMP process, thereby reducing the risk of copper diffusion.

Problem Identified by the Inventors—FIGS. 1–6

The inventors have identified a problem in a process known to them for forming copper interconnects for a semiconductor device using a dual-damascene process. The problem identified by the inventors is that chemically-mechanically polishing copper (Cu CMP) can cause diffusion of the copper, resulting in contamination and reduced dielectric strength. The problem process is described with reference to FIGS. 1–6.

Figure 1:
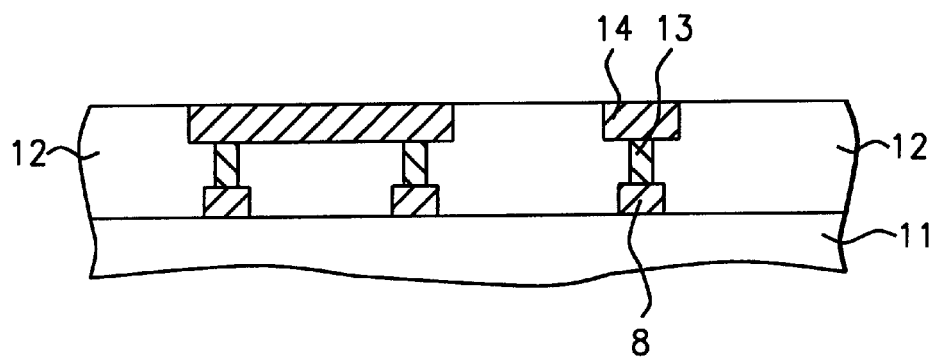
FIGS. 1 through 6 illustrate sequential sectional views of a process known to the inventors for forming copper interconnects, which suffers from a copper diffusion problem during copper CMP.

Referring to FIG. 1, the problem process known to the inventors begins by providing a semiconductor structure (11) having a first metal layer (14) thereover. The first metal layer (14) can be in the form of metal lines deposited in trenches in a dielectric layer (12), wherein conductive plugs (13) connect the first metal layer (14) to devices (8) on the semiconductor substrate (11).

Semiconductor structure (11) is understood to possibly include a substrate comprising a semiconducting material such as monocrystalline silicon or germanium or a silicon on insulator (SOI) structure as is known in the art. Semiconductor structure (11) is understood to possibly further include conductive layers and/or insulating layers formed over a substrate or the like, and passive and or active devices formed over and/or in the substrate or the like.

A resist layer (20) is formed over the first metal layer (14). The resist layer (20) prevents diffusion of the copper and can act as an anti-reflective coating during photolithographic exposure. The resist layer (20) is typically composed of silicon nitride having a thickness of between about 1000 Angstroms and 2000 Angstroms.

Figure 2:
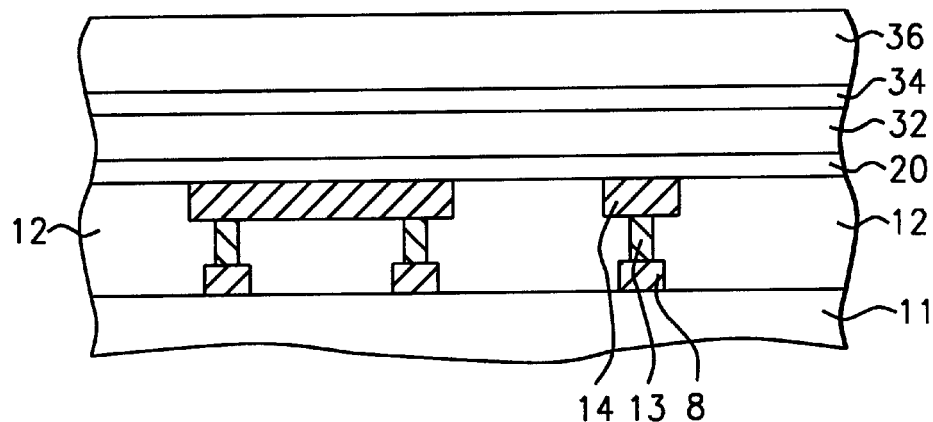

Referring to FIG. 2, a first inter-metal dielectric layer (32), an etch stop layer (34), and a second inter-metal dielectric layer (36) are successively formed over the resist layer. The first inter-metal dielectric layer (32) is typically composed of silicon dioxide having a thickness of between about 8000 Angstroms and 10000 Angstroms. The etch stop layer can be formed of silicon nitride or silicon oxynitride having a thickness of between about 1000 Angstroms and 2000 Angstroms. The second inter-metal dielectric layer (36) is typically composed of silicon dioxide having a thickness of between about 3000 Angstroms and 5000 Angstroms.

Figure 3:
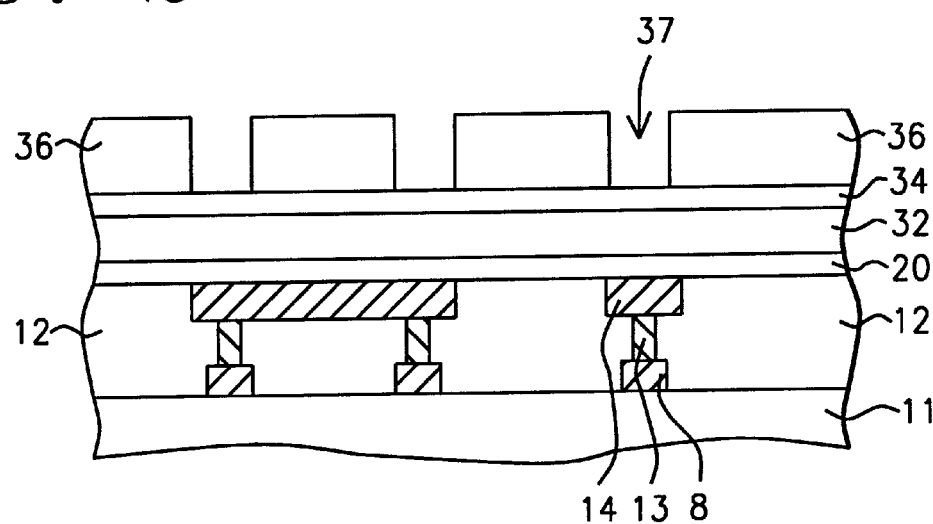

Referring to FIG. 3, the second inter-metal dielectric layer (36) is patterned to form via openings (37). The second inter-metal dielectric layer (36) can be patterned using photolithography (e.g. deposit phtoresist, expose, develop, and etch) as is known in the art. The etch stop later (34) prevents the via openings (37) from extending into the first inter-metal dielectric layer (32).

Figure 4:
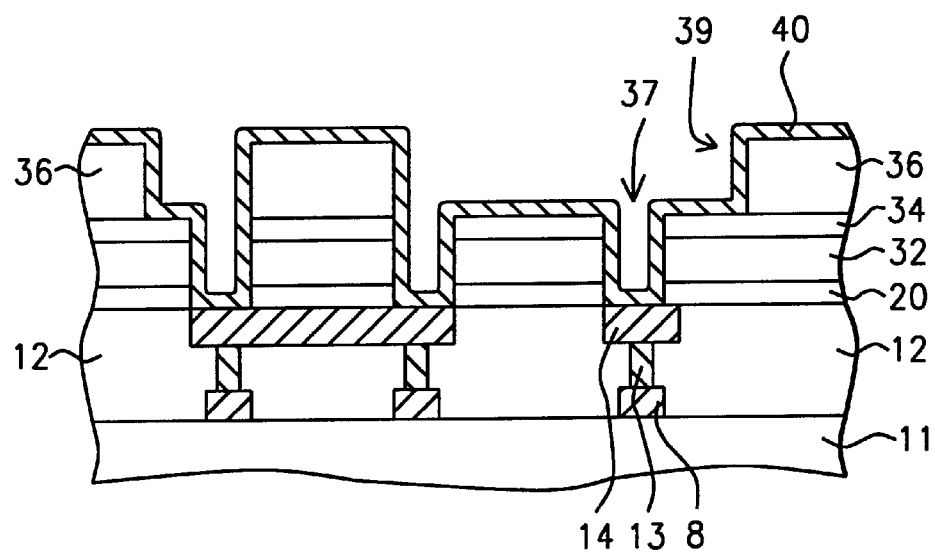

Referring to FIG. 4, the second inter-metal dielectric layer (36), the etch stop layer (34), and the first inter-metal dielectric layer (32) are patterned to extend the via openings (37) through the etch stop layer (34) and the first inter-metal dielectric layer (32) to the first metal layer (14); and to form trench openings (39) in the second inter-metal dielectric layer (36).

Still referring to FIG. 4, a barrier/seed layer (40) is formed on the bottom and sidewalls of the via openings (37) and trench openings (39). The barrier/seed layer (40) comprises a barrier layer which typically comprises tantalum nitride (TaN), and a seed layer which typically comprises copper overlying the barrier layer. The seed layer is typically formed using a chemical vapor deposition process.

Figure 5:
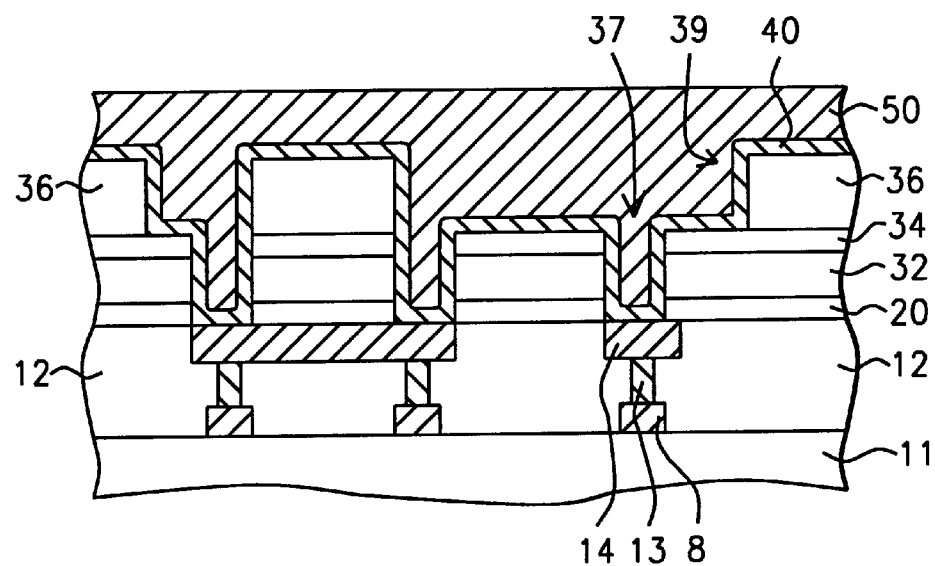

Referring to FIG. 5, a copper layer (50) is formed on the barrier/seed layer (40) having a sufficient thickness such that the via openings (37) and trench openings (39) are completely filled.

Figure 6:
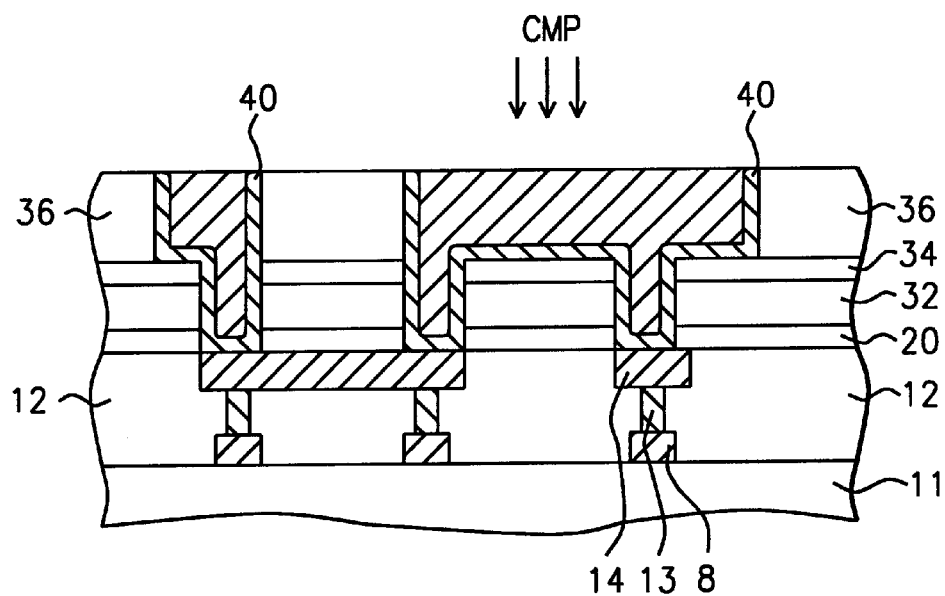

Referring to FIG. 6, the copper layer (50) and the barrier/seed layer (40) are then planarized using a chemical-mechanical polishing process (CMP), stopping on the second inter-metal dielectric layer (36). However, the copper used to form the metal interconnects diffuses during the CMP process, resulting in contamination and a reduced dielectric strength.

Preferred Embodiment of the Present Invention—
FIGS. 7 through 13

Figure 7:
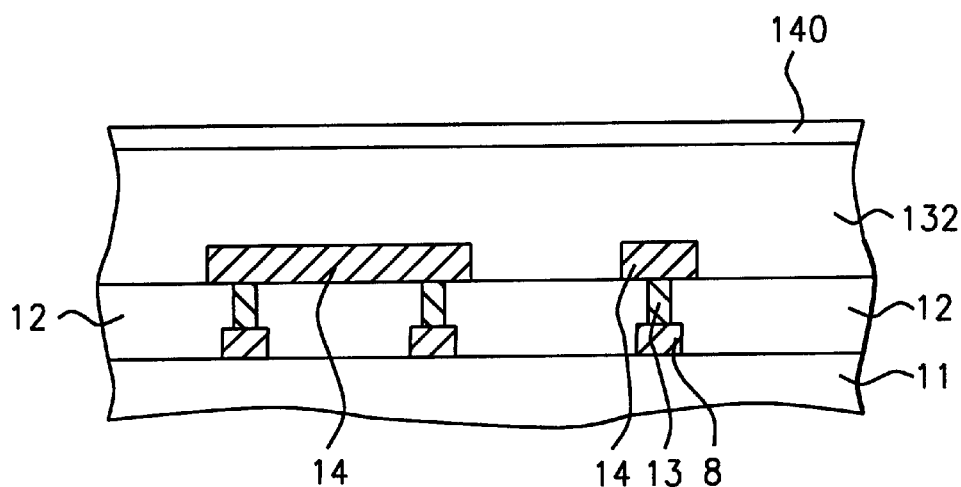
FIGS. 7 through 13 illustrate sequential sectional views of a process for forming copper interconnects for a semiconductor device, according to the present invention, which does not require a copper CMP process, thereby reducing the risk of copper diffusion.

Referring to FIG. 7, the preferred embodiment of the present invention begins by providing a semiconductor structure (11) having a first metal layer (14) thereover. The first metal layer (14) can be in the form of metal lines deposited in trenches in a dielectric layer (12), wherein conductive plugs (13) connect the first metal layer (14) to devices (8) on the semiconductor substrate (11).

Semiconductor structure (11) is understood to possibly include a substrate comsisting of a semiconducting material such as monocrystalline silicon or germanium or a silicon on insulator (SOI) structure as is known in the art. Semiconductor structure (11) is understood to possibly further include conductive layers and/or insulating layers formed over a substrate or the like, and passive and or active devices formed over and/or in the substrate or the like.

Still referring to FIG. 7, in the preferred embodiment of the present invention, a first inter-metal dielectric layer (132) is formed over the first metal layer (14) and planarized. The first inter-metal dielectric layer (132) can be composed of silicon dioxide having a thickness of between about 8000 Angstroms and 10000 Angstroms. Alternatively, the first inter-metal dielectric layer (132) can be composed of a low-K dielectric material such as FSG, HSQ, or QT2000B having a thickness of between about 5000 Angstroms and 8000 Angstroms. Then, the first inter-metal dielectric layer is planarized, preferably using an oxide CMP process.

Still referring to FIG. 7, a first resist layer (140) is formed over the first inter-metal dielectric layer (132). The first resist layer (140) is comprised of a dielectric material having good resistance to copper diffusion, such as silicon nitride. The first resist layer can also act as an anti-reflective coating during photolithography. The first resist layer preferably has a thickness of between about 2000 Angstroms and 4000 Angstroms.

Figure 8:
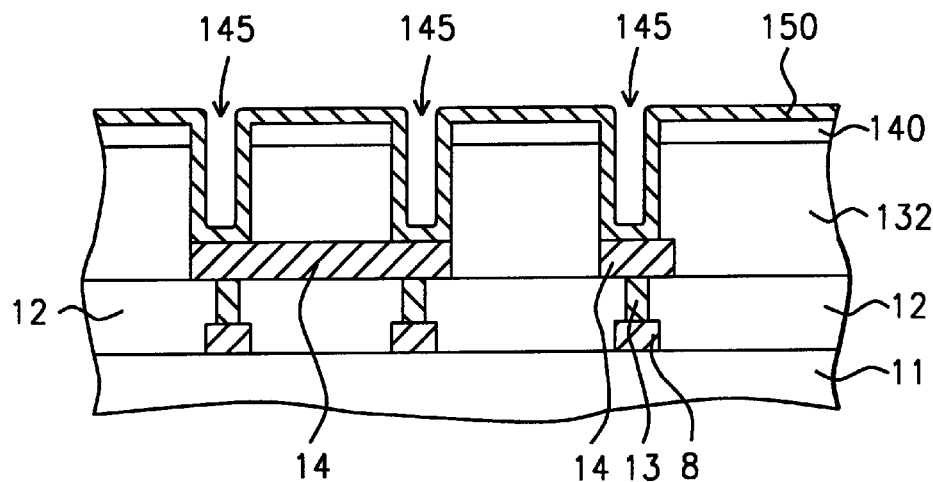

Referring to FIG. 8, the first resist layer (140) and the first inter-metal dielectric layer are patterned to form via openings (145). The via openings (145) are preferably formed using photolithography (e.g. deposit photoresist, expose, develop, etch), such that the first metal layer (14) is exposed and forms the bottoms of the via openings (145).

Still referring to FIG. 8, a barrier/seed layer (150) is formed on the sidewalls and bottoms of the via openings (145). The barrier/seed layer (150) comprises a barrier layer and an overlying seed layer. The barrier layer comprises a conductive material suitable for preventing copper migration and providing adhesion, such as tantalum nitride (TaN). The seed layer comprises copper deposited on the barrier layer using a chemical vapor deposition process. The barrier layer preferably has a thickness of between about 200 Angstroms and 300 Angstroms. The seed layer preferably has a thickness of between about 100 Angstroms and 200 Angstroms.

Figure 9:
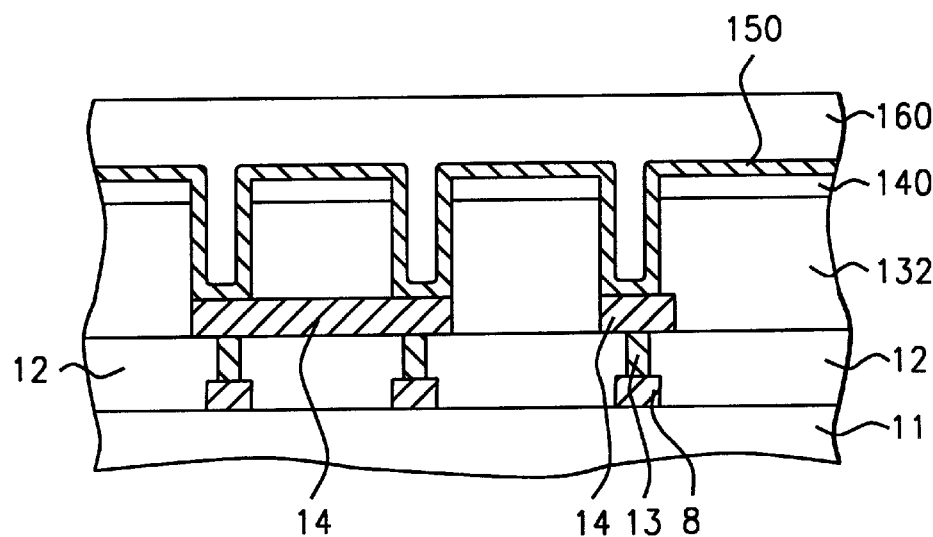

Referring to FIG. 9, a self-align layer (160) is formed over the barrier/seed layer (150). The self-align layer (160) is comprises a high-resistivity, inorganic material, such as silicon oxide, and has a thickness of between about 3000 Angstroms and 5000 Angstroms. The self-align layer (160) also acts as a diffusion barrier, preventing copper from diffusing into the first inter-metal dielectric layer.

Figure 10:
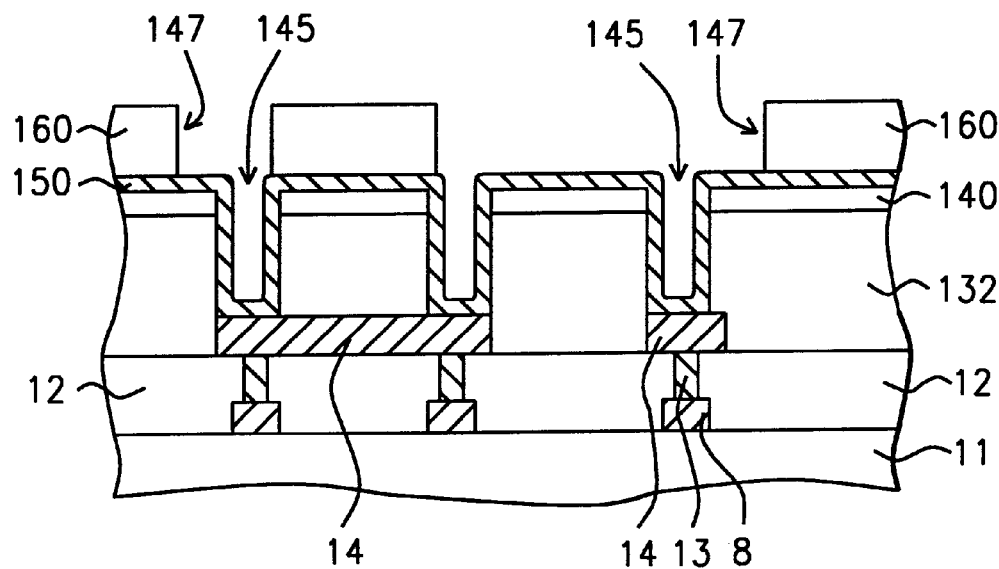

Referring to FIG. 10, the self-align layer (160) is patterned to reform the via openings (145) and to form trench openings (147). The barrier/seed layer (150) forms the bottoms of the trenches, and the bottoms and sidewalls of the via openings (145). The self-align layer (160) is preferably patterned using photolithography (e.g. deposit photoresist, expose photoresist, develop photoresist, etch underlying self-aligned layer), wherein the etch process is selective to the self-aligned layer over the seed layer. For a self-align layer comprising silicon oxide and a seed layer composed of copper, the etch can be performed using a silicon oxide dry etch.

Figure 11:
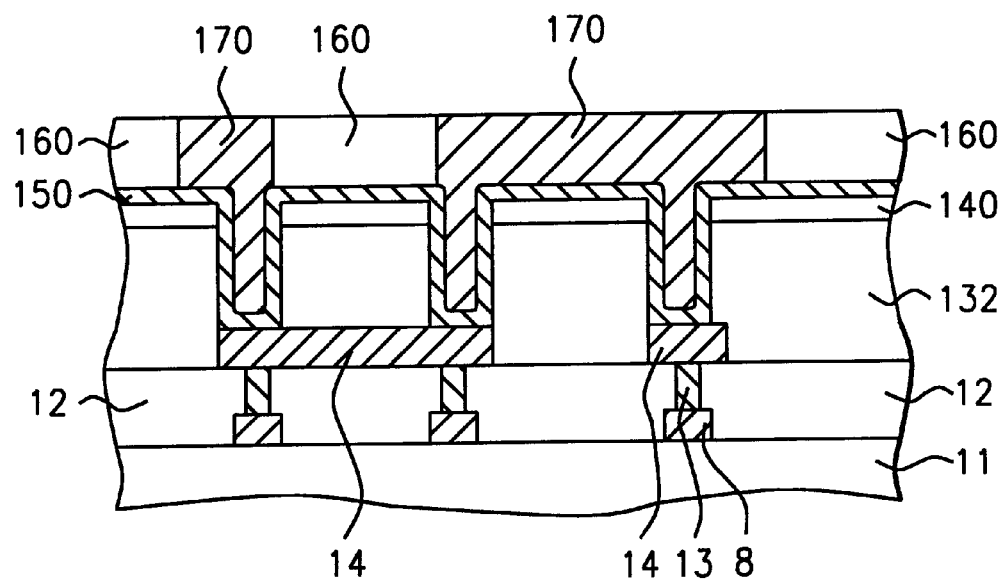

Referring to FIG. 11, a copper layer (170) (e.g. second metal layer) is electroplated onto the exposed barrier/seed layer (150) at the bottoms and sidewalls of the via openings (145) and at the bottom of the trench openings (147). The seed layer (150) is electrified, and because the self-align layer is not conductive, the copper layer does not form on the areas covered by the self-align layer. The key advantage of the present invention is that no copper CMP process is required, thereby reducing the risk of copper diffusion.

Figure 12:
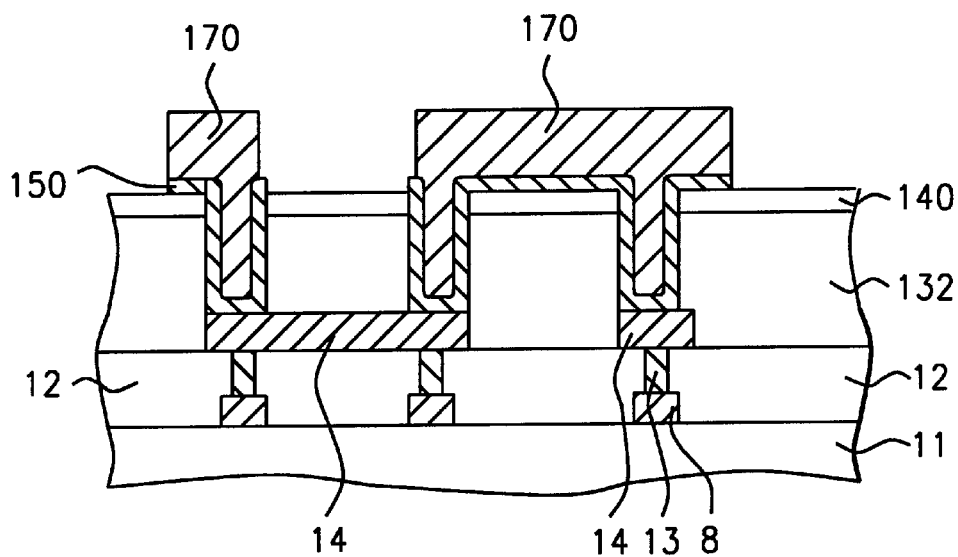

Referring to FIG. 12, the remaining portions of the self-align layer (not shown) are removed using an etch selective to silicon oxide over copper, such as silicon oxide dry etching. Then the exposed portions of the seed layer (not shown) are removed using an ion bombardment etch (because the thickness of the seed layer is much thinner than the metal line), and the portions of the barrier layer (not shown), exposed by the seed layer etch, are removed using an etch selective to tantalum nitride over copper.

Figure 13:
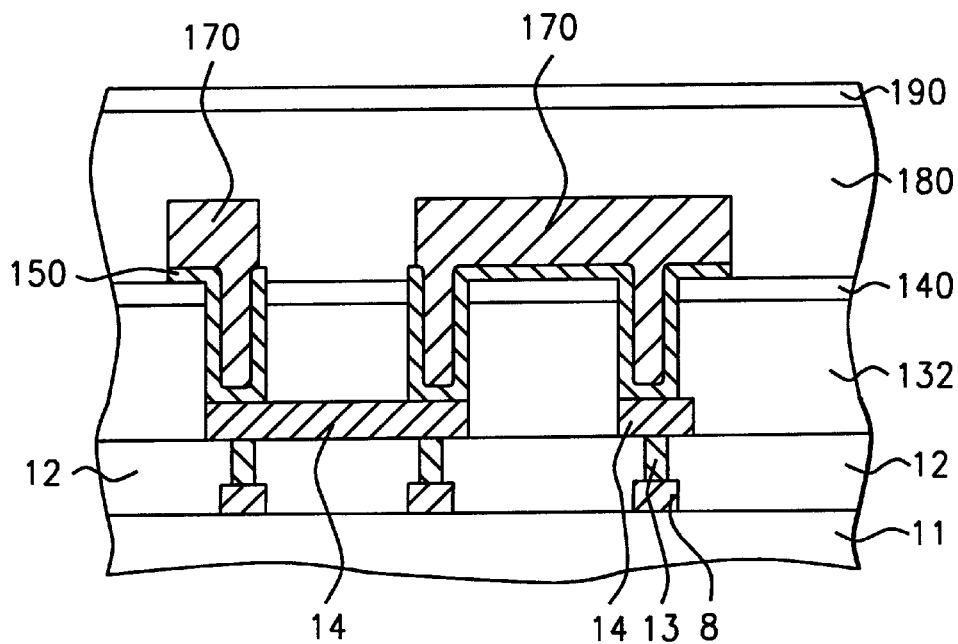

Fabrication of a semiconductor device according to the present invention can continue using the processes and methods described herein and processes known in the art. For example, FIG. 13 shows a device fabricated according to the present invention wherein a second inter-metal dielectric (180) is formed over the copper layer (170) and first resist layer (140). A second resist layer (190) is formed over the second inter-metal dielectric (180). A third metal layer can be formed over the second intermetal dielectric layer (180), and so on until the desired number of metal layers are formed.

The present invention therefore, provides a method of forming copper interconnections which substitutes an oxide CMP process for a copper CMP process, reducing the risk of copper diffusion. While the invention has been particularly shown and described with reference to the preferred embodiments thereof, it will be understood by those skilled in the art that various changes in form and details may be made without departing from the spirit and scope of the invention.

What is claimed is:

1. A method for forming copper interconnects, without inducing copper diffusion, comprising the steps of:
   a. providing a semiconductor structure having a first metal layer thereover;
   b. forming a first inter-metal dielectric layer over said first metal layer and planarizing said first inter-metal dielectric layer;
   c. forming a first resist layer over said first inter-metal dielectric layer;
   d. patterning said first resist layer and said first inter-metal dielectric layer to form via openings having sidewalls; said first metal layer forming the bottoms of said via openings;
   e. forming a barrier/seed layer on said sidewalls and said bottoms of said via openings;
   f. forming a self-align layer over said barrier/seed layer; said self-align layer being composed of a high-resistivity, inorganic material;
   g. patterning said self-align layer to reform said via openings and to form trench openings; said barrier/seed layer forming the bottoms of said trenches;
   h. electroplating a copper layer onto the exposed barrier/seed layer at said bottoms and said sidewalls of said via openings and on said bottom of said trenches; and
   i. removing remaining portions of said self-align layer and exposed portions of said barrier/seed layer.

2. The method of claim 1 wherein said barrier/seed layer comprises a tantalum nitride barrier layer having a thickness of between about 200 Angstroms and 300 Angstroms and a copper seed layer having a thickness of between about 100 Angstroms and 200 Angstroms overlying said barrier layer.

3. The method of claim 2 wherein said self-align layer is composed of silicon oxide having a thickness of between about 3000 Angstroms and 5000 Angstroms.

4. The method of claim 3 wherein said self-align layer is patterned using photolithography and a selective dry etching process.

5. The method of claim 1 wherein said first resist layer is composed of silicon nitride having a thickness of between about 1000 Angstroms and 2000 Angstroms.

6. The method of claim 2 wherein, following electroplating said copper layer, said remaining portions of said self-align layer are removed using a silicon oxide dry etch; said exposed portions of said seed layer are removed using an ion bombardment etch; and said exposed portions of said barrier layer are removed using a selective dry etch.

7. The method of claim 1 which further includes, following step i, forming a second inter-metal dielectric layer over said copper layer.

8. The method of claim 1 wherein said first inter-metal dielectric layer is composed of silicon dioxide having a thickness of between about 8000 Angstroms and 10000 Angstroms.

9. The method of claim 1 wherein said first inter-metal dielectric layer is composed of a low-K dielectric material having a thickness of between about 5000 Angstroms and 8000 Angstroms.

10. A method for forming copper interconnects, without using a copper chemical-mechanical polishing process, comprising the steps of:
   a. providing a semiconductor structure having a first metal layer thereover;
   b. forming a first inter-metal dielectric layer over said first metal layer and planarizing said first inter-metal dielectric layer;
   c. forming a first resist layer over said first inter-metal dielectric layer;
   d. patterning said first resist layer and said first inter-metal dielectric layer to form via openings having sidewalls; said first metal layer forming the bottoms of said via openings;
   e. forming a barrier/seed layer on said sidewalls and said bottoms of said via openings; said barrier/seed layer comprising a tantalum nitride barrier layer with a copper seed layer deposited thereover using a chemical vapor deposition process;

f. forming a self-align layer over said barrier/seed layer; said self-align layer being composed of a high-resistivity, inorganic material;

g. patterning said self-align layer to reform said via openings and to form trench openings; said seed layer of said barrier/seed layer forming the bottoms of said trenches;

h. electroplating a copper layer onto the exposed seed layer at said bottoms and said sidewalls of saids via openings and on said bottom of said trenches;

i. removing remaining portions of said self-align layer, removing exposed portions of said seed layer, and removing exposed portions of said barrier layer;

j. forming a second inter-metal dielectric layer over said copper layer; and k. forming a second resist layer over said second inter-metal dielectric layer.

11. The method of claim 10 wherein said seed layer is comprises copper having a thickness of between about 100 Angstroms and 200 Angstroms; said barrier layer comprises tantalum nitride having a thickness of between about 200 Angstroms and 300 Angstroms; said self-align layer is comprises siliocon oxide having a thickness of between about 3000 Angstroms and 5000 Angstroms; and said self-align layer is patterned using photolithography and a silicon oxide dry etching process.

12. The method of claim 10 wherein said first resist layer is composed of silicon nitride having a thickness of between about 1000 Angstroms and 2000 Angstroms, and said second resist layer is composed of silicon nitride having a thickness of between about 1000 Angstroms and 2000 Angstroms.

13. The method of claim 1 wherein said first inter-metal dielectric layer is composed of silicon dioxide having a thickness of between about 8000 Angstroms and 10000 Angstroms, and said second inter-metal dielectric layer is composed of silicon dioxide having a thickness of between about 8000 Angstroms and 10000 Angstroms.

14. The method of claim 1 wherein said first inter-metal dielectric layer is composed of a low-K dielectric material having a thickness of between about 5000 Angstroms and 8000 Angstroms, and said second inter-metal dielectric layer is composed of a low-K dielectric material having a thickness of between about 5000 Angstroms and 8000 Angstroms.

15. The method of claim 10 which further includes repeating steps d through j to form additional copper layers.

* * * * *